(12) United States Patent
Jacob

(10) Patent No.: US 9,824,935 B2
(45) Date of Patent: Nov. 21, 2017

(54) METHODS OF FORMING NMOS AND PMOS FINFET DEVICES AND THE RESULTING PRODUCT

(71) Applicant: GLOBALFOUNDRIES Inc., Grand Cayman (KY)

(72) Inventor: Ajey Poovannummoottil Jacob, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/643,036

(22) Filed: Jul. 6, 2017

(65) Prior Publication Data
US 2017/0301589 A1    Oct. 19, 2017

Related U.S. Application Data

(62) Division of application No. 14/608,902, filed on Jan. 29, 2015, now Pat. No. 9,741,622.

(51) Int. Cl.
| | |
|---|---|
| *H01L 21/8238* | (2006.01) |
| *H01L 29/66* | (2006.01) |
| *H01L 21/265* | (2006.01) |
| *H01L 29/165* | (2006.01) |

(52) U.S. Cl.
CPC ........ *H01L 21/823821* (2013.01); *H01L 21/823807* (2013.01); *H01L 21/823878* (2013.01); *H01L 29/66545* (2013.01); *H01L 21/26506* (2013.01); *H01L 29/165* (2013.01)

(58) Field of Classification Search
CPC ..... H01L 21/823821; H01L 21/823807; H01L 21/823878
See application file for complete search history.

(56) References Cited

U.S. PATENT DOCUMENTS

| | | |
|---|---|---|
| 9,064,890 B1 | 6/2015 | Xie et al. |
| 2011/0171795 A1 | 7/2011 | Tsai et al. |
| 2015/0255608 A1 | 9/2015 | Cai et al. |

*Primary Examiner* — Errol Fernandes
(74) *Attorney, Agent, or Firm* — Amerson Law Firm, PLLC

(57) ABSTRACT

A method includes forming an initial strain relaxed buffer layer on a semiconductor substrate. A trench is formed within the initial strain relaxed buffer layer. An epitaxial deposition process is performed to form an in situ carbon-doped strain relaxed buffer layer in the trench. A channel semiconductor material is formed on the initial strain relaxed buffer layer and on the in situ carbon-doped strain relaxed buffer layer in the trench. A plurality of fin-formation trenches that extend into the initial strain relaxed buffer layer is formed so as to thereby form an NMOS fin including the channel semiconductor material and the in situ carbon-doped strain relaxed buffer layer and a PMOS fin including the channel semiconductor material and the initial strain relaxed buffer layer. A recessed layer of insulating material and gate structures are formed around the NMOS fin and the PMOS fin.

15 Claims, 13 Drawing Sheets

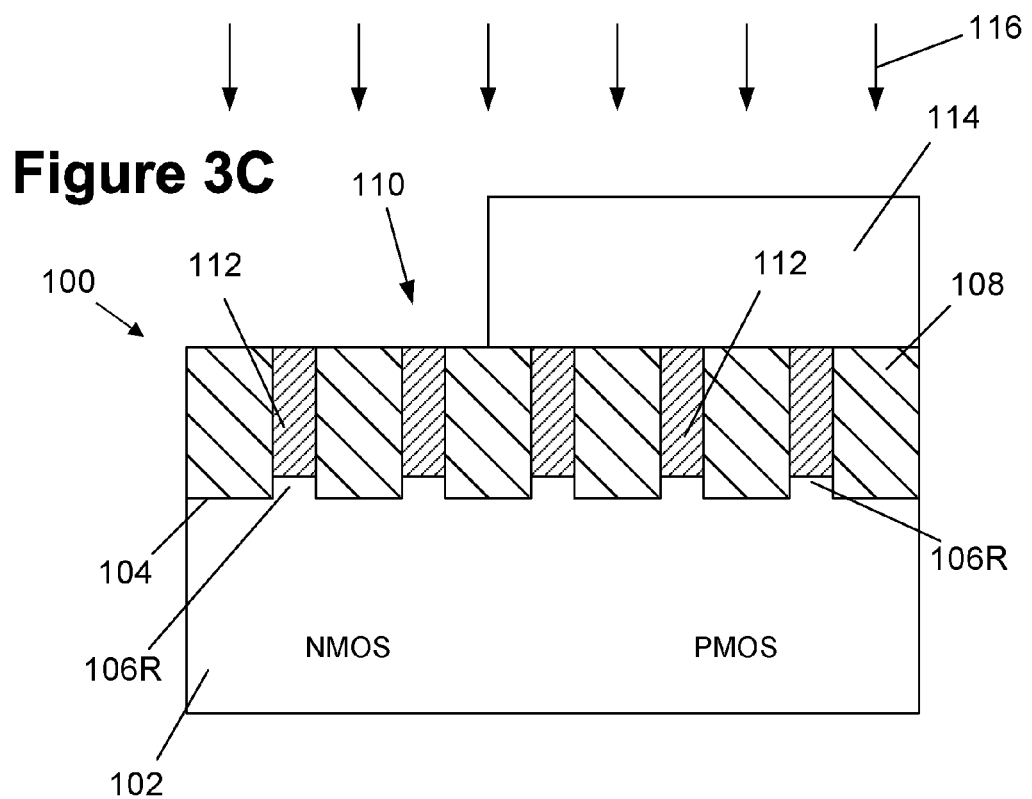
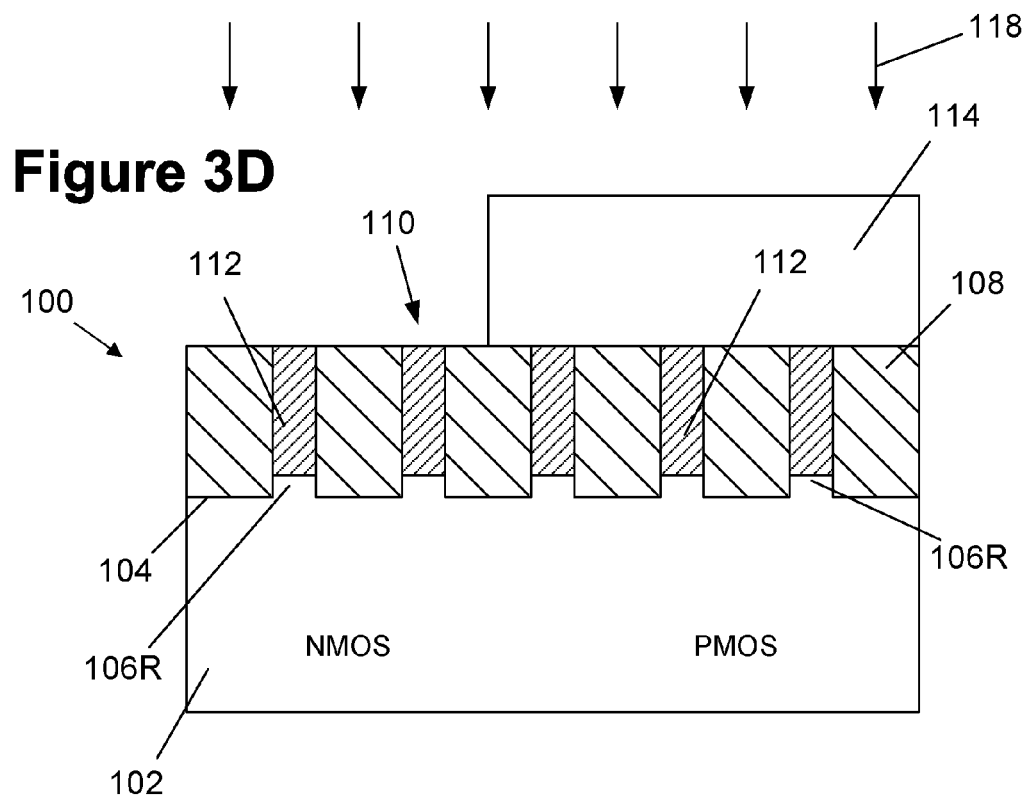

METHODS OF FORMING NMOS AND PMOS FINFET DEVICES AND THE RESULTING PRODUCT

BACKGROUND OF THE INVENTION

1. Field of the Invention

Generally, the present disclosure relates to the manufacture of FET semiconductor devices, and, more specifically, to various methods of forming NMOS and PMOS FinFET semiconductor devices with appropriate band offsets and the resulting product.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A conventional FET is a planar device that typically includes a source region, a drain region and a channel region that is positioned between the source region and the drain region, and a gate electrode positioned above the channel region. Current flow through the FET is controlled by controlling the voltage applied to the gate electrode. For example, for an NMOS device, if there is no voltage applied to the gate electrode, then there is no current flow through the NMOS device (ignoring undesirable leakage currents, which are relatively small). However, when an appropriate positive voltage is applied to the gate electrode, the channel region of the NMOS device becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the past decades. More specifically, the channel length of FETs has been significantly decreased, which has resulted in improving the switching speed and in lowering operation currents and voltages of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a planar FET, there are so-called 3D devices, such as an illustrative FinFET device, which is a three-dimensional structure. FIG. 1 is a perspective view of an illustrative prior art FinFET semiconductor device 10 that is formed above a semiconductor substrate 12. The device 10 includes three illustrative fins 14, a gate structure 16, sidewall spacers 18 and a gate cap layer 20. The gate structure 16 is typically comprised of a layer of insulating material (not separately shown), e.g., a layer of high-k insulating material, and one or more conductive material layers that serve as the gate electrode for the device 10. In this example, the fins 14 are comprised of a substrate fin portion 14A and an alternative fin material portion 14B. The substrate fin portion 14A may be made of silicon, i.e., the same material as the substrate, and the alternative fin material portion 14B may be made of a material other than the substrate material, for example, silicon-germanium. The fins 14 have a three-dimensional configuration: a height H, a width W and an axial length L. The axial length L corresponds to the direction of current travel in the device 10 when it is operational. The portions of the fins 14 covered by the gate structure 16 are the channel regions of the FinFET device 10. In a conventional process flow, the portions of the fins 14 that are positioned outside of the spacers 18, i.e., in the source/drain regions of the device 10, may be increased in size or even merged together (not shown in FIG. 1) by performing one or more epitaxial growth processes. The process of increasing the size of or merging the fins 14 in the source/drain regions of the device 10 is performed to reduce the resistance of source/drain regions and/or make it easier to establish electrical contact to the source/drain regions.

In the FinFET device 10, the gate structure 16 encloses both sides and the upper surface of all or a portion of the fins 14 to form a tri-gate structure so as to use a channel having a three-dimensional structure instead of a planar structure. In some cases, an insulating cap layer, e.g., silicon nitride, is positioned at the top of the fins 14 and the FinFET device only has a dual-gate structure (sidewalls only). Unlike a planar FET, in a FinFET device, a channel is formed perpendicular to a surface of the semiconducting substrate so as to increase the drive current per footprint of the device. Also, in a FinFET, the improved gate control through multiple gates on a narrow, fully-depleted semiconductor fin significantly reduces the short channel effects. When an appropriate voltage is applied to the gate electrode 16 of a FinFET device 10, the surfaces (and the inner portion near the surface) of the fins 14, i.e., the vertically oriented sidewalls and the top upper surface of the fin, form a surface inversion layer or a volume inversion layer that contributes to current conduction. Accordingly, for a given plot space (or footprint), FinFETs tend to be able to generate significantly higher drive current than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

Device manufacturers are under constant pressure to produce integrated circuit products with increased performance and lower production costs relative to previous device generations. Thus, device designers spend a great amount of time and effort to maximize device performance while seeking ways to reduce manufacturing costs and improve manufacturing reliability. As it relates to 3D devices, device designers have spent many years and employed a variety of techniques in an effort to improve the performance, capability and reliability of such devices. One technique used by device designers to improve device performance is to apply a desired stress to the channel region of a device, i.e., create a tensile stress in the channel region for NMOS transistors and create a compressive stress in the channel region for PMOS transistors. Stress engineering techniques typically involve the formation of specifically made silicon nitride layers, spacers or epi semiconductor layers that are designed to impart the desired stress on the channel region. Device designers are also currently investigating using alternative semiconductor materials, such as so-called SiGe, Ge and III-V materials, to manufacture FinFET devices which are intended to enhance the performance capabilities of such devices, e.g., to enable low-voltage operation without degrading their operating speed.

However, the integration of such alternative materials on silicon substrates (the dominant substrates used in the industry) is non-trivial due to, among other issues, the large difference in lattice constants between such alternative materials and silicon. That is, with reference to FIG. 1, the lattice constant of the alternative fin material portion 14B of the fin 14 may be substantially greater than the lattice constant of the substrate fin portion 14A of the fin 14. As a result of this mismatch in lattice constants, an unacceptable number of defects may be formed or created in the alternative fin material portion 14B. As used herein, a "defect" essentially refers to a misfit dislocation at the interface between the portions 14A and 14B of the fin 14 or threading dislocations that propagate through the portion 14B on the fin 14 at well-defined angles corresponding to the (111) plane.

Typically, the formation of alternative materials for Fin-FET devices involves forming the initial fin structures in the substrate, forming a layer of insulating material around the fins, exposing the upper surface of the fins and then performing a timed recessing etching process to remove a portion of the fin, thereby producing a recessed fin structure. Thereafter, the alternative fin material (e.g., 14B in FIG. 1) is grown on the recessed fin structure by performing an epitaxial deposition process.

Typically, so-called SRB (strained relaxed buffer) layers are formed on the silicon fins prior to formation of the channel semiconductor material, such as a material containing a high concentration of germanium or substantially pure germanium. For example, a germanium channel material formed on an SRB layer having a relatively low percentage of germanium, e.g., 25% or less, can provide substantial band offset isolation for PMOS devices. However, band offset isolation is not possible for an NMOS device using the same SRB layer due to the different nature and composition of an NMOS device and a PMOS device. This is problematic for many integrated circuit products that are manufactured using CMOS technology, i.e., using both NMOS and PMOS devices. The formation of separate SRB layers for NMOS and PMOS devices would increase processing complexity and costs.

The present disclosure is directed to various methods of forming NMOS and PMOS FinFET semiconductor devices with appropriate band offsets and the resulting product that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming NMOS and PMOS FinFET semiconductor devices with appropriate band offsets and the resulting product. One illustrative method disclosed herein includes, among other things, forming an initial strain relaxed buffer layer on a surface of a semiconductor substrate. A trench is formed within the initial strain relaxed buffer layer in an NMOS region. An epitaxial deposition process is performed to form an in situ carbon-doped strain relaxed buffer layer in the trench. A channel semiconductor material is formed on the initial strain relaxed buffer layer and on the in situ carbon-doped strain relaxed buffer layer in the trench. A plurality of fin-formation trenches that extend into the initial strain relaxed buffer layer is formed so as to thereby form an NMOS fin including the channel semiconductor material and the in situ carbon-doped strain relaxed buffer layer and a PMOS fin including the channel semiconductor material and the initial strain relaxed buffer layer. A recessed layer of insulating material is formed around the NMOS fin and the PMOS fin in the fin-formation trenches so as to expose at least a portion of the NMOS fin and the PMOS fin. A first gate structure is formed around the NMOS fin. A second gate structure is formed around the PMOS fin.

Another illustrative method disclosed herein includes, among other things, forming a first silicon germanium layer on a surface of a semiconductor substrate. A trench is formed within the first silicon germanium layer in an NMOS region. An epitaxial deposition process is performed to form a second silicon germanium layer in the trench. The second silicon germanium layer is carbon-doped. A channel semiconductor material is formed on the first silicon germanium layer and on the second silicon germanium layer in the trench. A plurality of fin-formation trenches that extend into the first silicon germanium layer is formed so as to thereby form an NMOS fin including the channel semiconductor material and the second silicon germanium layer and a PMOS fin including the channel semiconductor material and the first silicon germanium layer. A recessed layer of insulating material is formed around the NMOS fin and the PMOS fin in the fin-formation trenches so as to expose at least a portion of the NMOS fin and the PMOS fin. A first gate structure is formed around the NMOS fin. A second gate structure is formed around the PMOS fin.

BRIEF DESCRIPTION OF THE DRAWINGS

The disclosure may be understood by reference to the following description taken in conjunction with the accompanying drawings, in which like reference numerals identify like elements, and in which:

FIGS. 3A-3G depict other novel methods disclosed herein for forming NMOS and PMOS FinFET semiconductor devices with appropriate band offsets and the resulting product.

Figure 1:
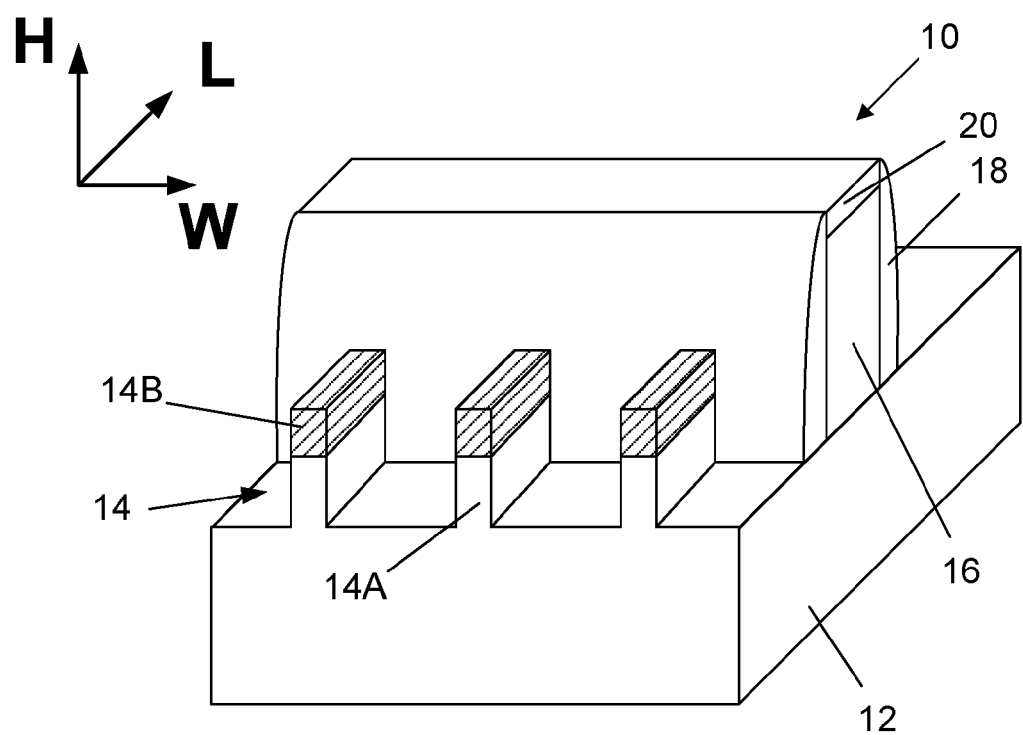
FIG. 1 depicts an example of a prior art FinFET device wherein the fins for the device are comprised of an alternative fin material formed above a substrate fin.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to methods of forming fins for a FinFET semiconductor device by forming and replacing sacrificial fin structures. The methods disclosed herein may be employed in manufacturing either an N-type device or a P-type device, and the gate structure of such devices may be formed using either so-called "gate-first" or "replacement gate" ("gate-last" or "gate-metal-last") techniques. As will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. With reference to the attached figures, various illustrative embodiments of the methods and devices disclosed herein will now be described in more detail.

Figure 2A:
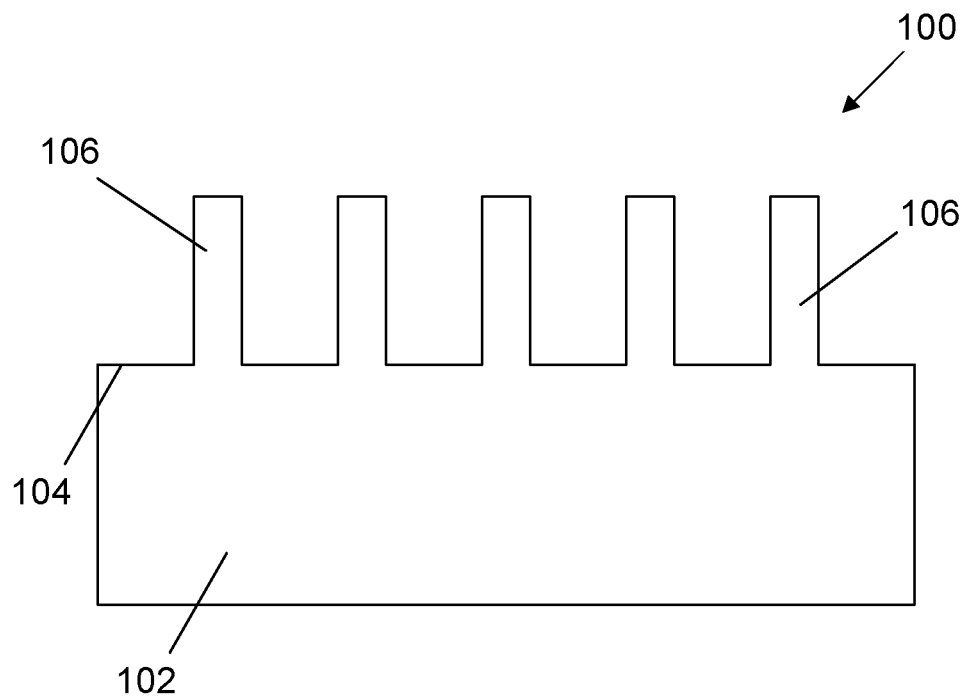
FIGS. 2A-2I depict various illustrative novel methods disclosed herein for forming NMOS and PMOS FinFET semiconductor devices with appropriate band offsets and the resulting product.

FIGS. 2A-2I depict various illustrative novel methods disclosed herein for forming NMOS and PMOS FinFET semiconductor devices with appropriate band offsets and the resulting product. With reference to FIG. 2A, the product 100 is depicted as being formed above a semiconductor substrate 102 comprised of a semiconductor material, such as, for example, a bulk silicon substrate. Thus, the terms "substrate," "semiconductor substrate" or "semiconducting substrate" should be understood to cover all semiconductor materials. An isolation material (not shown) may be formed in the substrate 102 to define spaced-apart active regions in the substrate 102. The isolation regions may be formed using traditional techniques, e.g., traditional shallow trench isolation regions may be formed in the substrate 102. In the case of the illustrative FinFET devices disclosed herein, the isolation regions may be formed before or after the formation of the fin structures that will be formed as described more fully below.

FIG. 2A depicts the product 100 after one or more etching processes, e.g., anisotropic etching processes, were performed through a patterned etch mask (not shown) to form a plurality of trenches 104 and thereby define a plurality of fins 106. The width and height of the fins 106 may vary depending upon the particular application. Additionally, the overall size, shape and configuration of the trenches 104 and fins 106 may vary depending on the particular application. In one illustrative embodiment, based on current day technology, the depth of the trenches 104 may range from approximately 50-200 nm and the width of the trenches 104 may be about 30 nm or less. In some embodiments, the fins 106 may have a final width within the range of about 3-12 nm. Of course, the above numbers are provided by way of example, and the formation of fins 106 should not be considered to be limited to such examples.

In the illustrative examples depicted in the attached drawings, the trenches 104 and the fins 106 are all depicted as having a uniform size and shape. However, such uniformity in the size and shape of the trenches 104 and the fins 106 is not required to practice at least some aspects of the inventions disclosed herein. In the attached figures, the trenches 104 are depicted as having been formed by performing an anisotropic etching process that results in the fins 106 having a schematically (and simplistically) depicted, generally rectangular configuration. In an actual real-world device, the sidewalls of the fins 106 may be somewhat outwardly tapered, although that configuration is not depicted in the attached drawings. Thus, the size and configuration of the trenches 104 and the fins 106, and the manner in which they are made, should not be considered a limitation of the present invention. For ease of disclosure, only the substantially rectangular trenches 104 and fins 106 will be depicted in the subsequent drawings. Moreover, the product 100 may be formed with any desired number of fins 106.

Figure 2B:
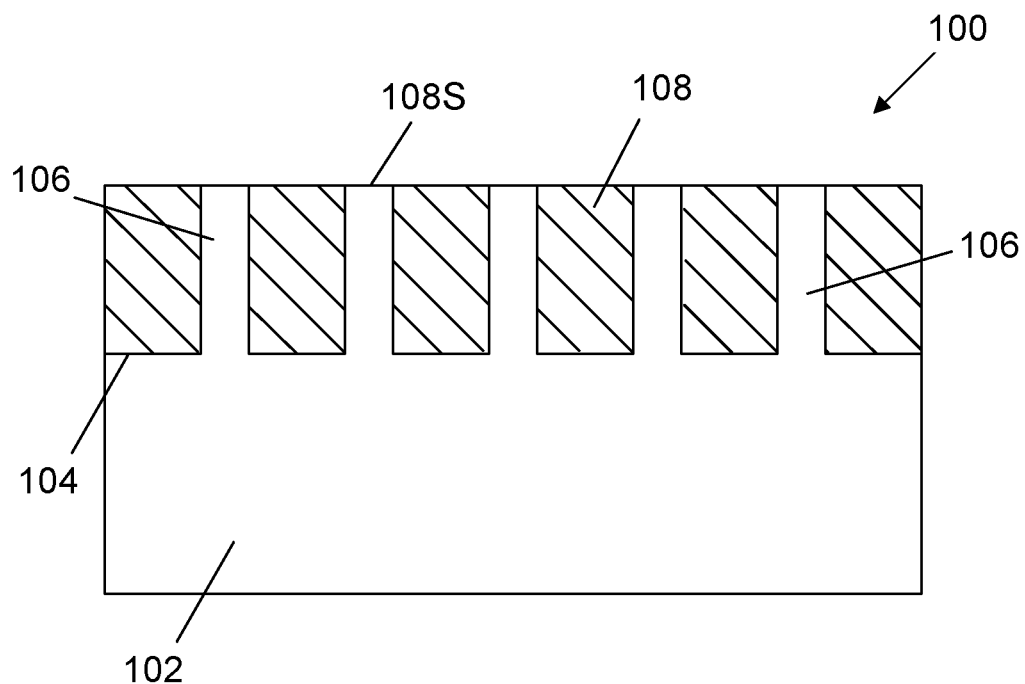

FIG. 2B depicts the product 100 after a layer of insulating material 108 (e.g., silicon dioxide) was deposited so as to overfill the trenches 104 and after at least one process operation, such as an optional chemical mechanical polishing (CMP) process, was performed to planarize the upper surface of the layer of insulating material 108 and thereby expose the upper surface 106S of the fins 106. In some embodiments, rather than remove the patterned mask layer (not shown) prior to the formation of the layer of insulating material 108, the layer of insulating material 108 may be deposited so as to overfill the trenches 104 and the patterned mask layer. Thereafter, one or more CMP processes may be performed to remove the patterned mask layer and portions of the layer of insulating material 108, stopping on the upper surface 106S of the fins 106.

Figure 2C:
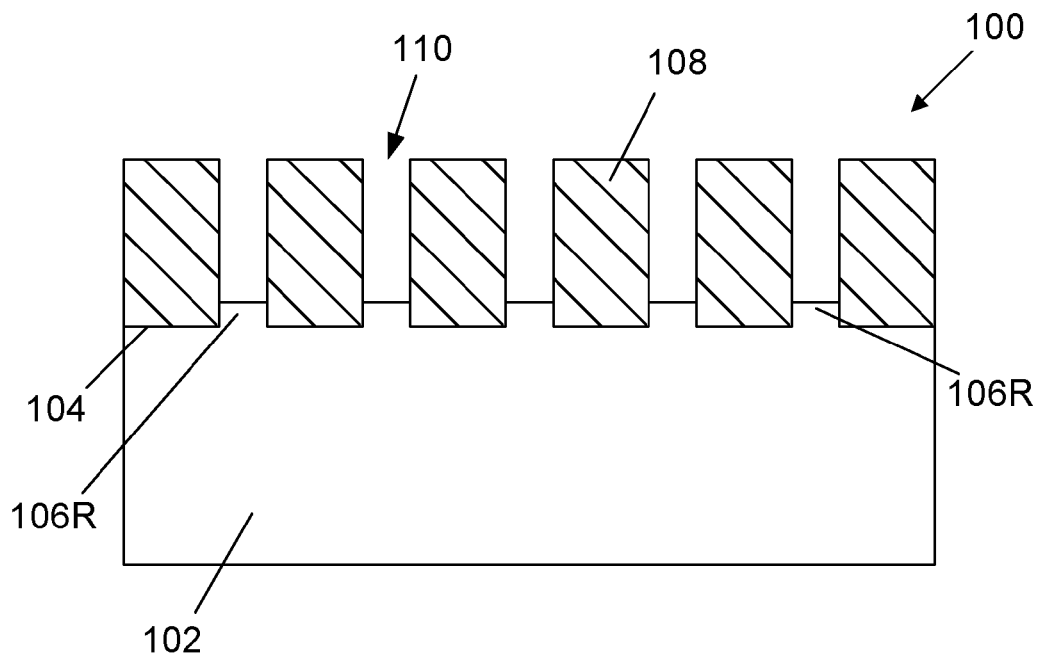

FIG. 2C depicts the product 100 after a timed recess etching process was performed to remove portions of the fins 106. The process operation results in the formation of a plurality of recessed fins 106R and a plurality of replacement fin cavities 110. The amount of the fin removed during the recess etching process may vary depending upon the particular application.

Figure 2D:
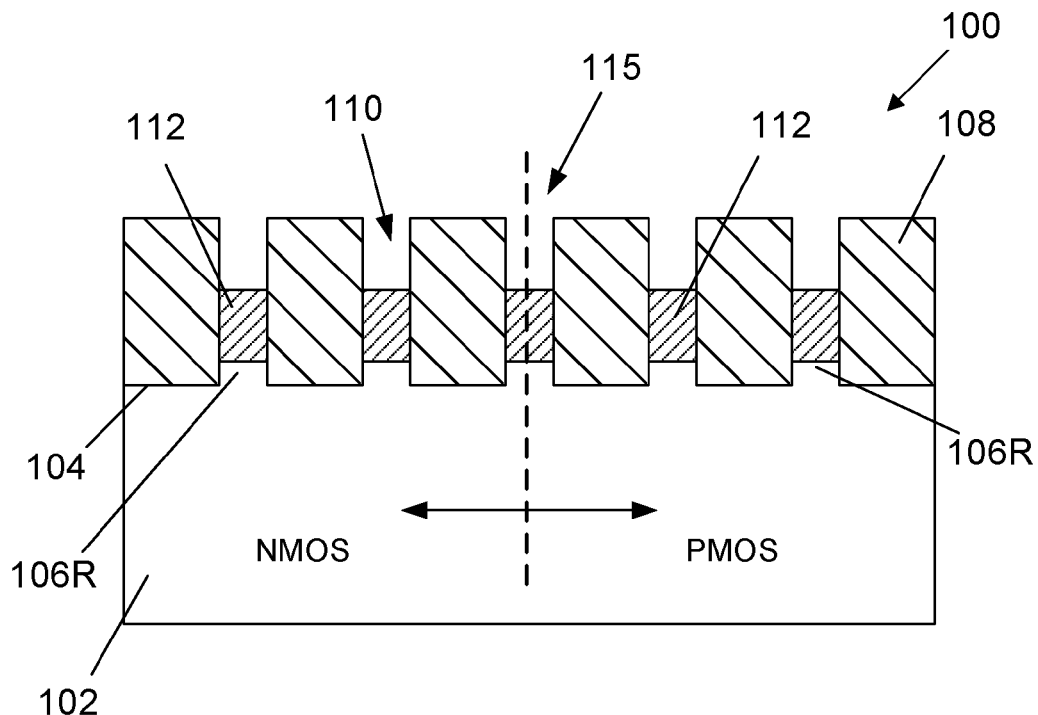

In the example depicted herein, the product 100 will be comprised of an NMOS device and a PMOS device, as depicted in FIG. 2D. As will be discussed more fully below, at some point in the process flow prior to gate formation, the middle fin 115 will be removed to make room for an isolation structure that will isolate the two devices. The manner in which fins are removed and replaced with isolation material are well known to those skilled in the art. With continuing reference to FIG. 2D, a strain relaxed buffer (SRB) layer 112 is formed on the recessed fins 106R so as to partially fill the replacement fin cavities 110. The SRB layer 112 may be formed to any desired thickness (or height) and it may be made of a variety of different materials. In one embodiment, the SRB layer 112 may be made of silicon germanium ($Si_{(1-x)}Ge_x$ where "x" ranges from 0-1), and it may be formed by performing an epitaxial growth process. The SRB layer 112 may be formed such that it is in a partially relaxed condition. The manner in which such SRB layers are formed so as to be in a partially relaxed condition are well known to those skilled in the art.

Figure 2E:
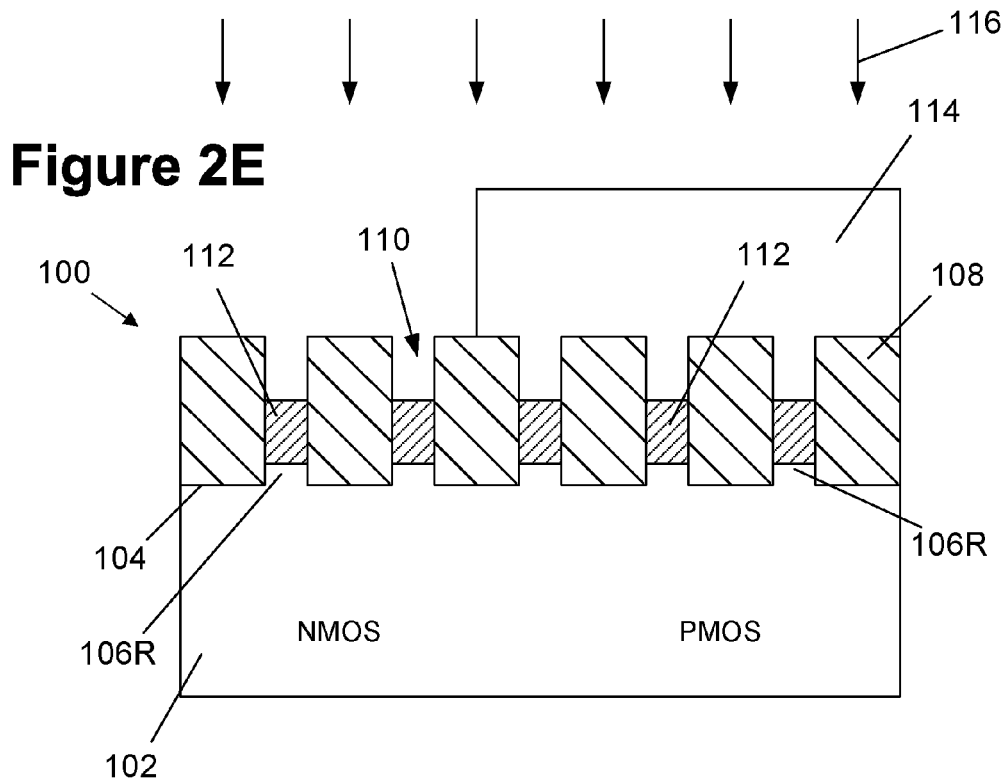

FIG. 2E depicts the product 100 after several process operations were performed. First, a masking layer 114, such as a patterned photoresist mask or a patterned hard mask, was formed so as to cover the PMOS region and expose the NMOS region for further processing. Thereafter, a carbon implantation process 116 was performed to implant carbon atoms into the exposed portion of the SRB layer 112. In one illustrative example, the carbon implantation process 116 was performed using a carbon dose of about 1E13-1E14 ions/cm$^2$ and at an energy level of about 20-30 keV, which results in the SRB layer 112 for the NMOS device having a carbon concentration that falls within the range of about 1E19-1E21 ions/cm$^3$. In some cases, the carbon implantation process 116 may be designed such that the carbon is implanted throughout the entire thickness of the SRB layer 112, although such a situation may not be required to practice at least some aspects of the inventions disclosed herein. That is, in some applications, the carbon implantation process 116 may be designed such that the carbon is implanted only partially into the thickness of the SRB layer 112. The purpose of the carbon implant process is to adjust the band gap offset for NMOS devices in a CMOS process flow application. The introduction of carbon into silicon increases the bandgap in silicon. Implanting carbon into SiGe also increases the bandgap in SiGe as well. Thus, there is a conduction band offset for a SiGe channel material that is formed on a SiGe:C SRB layer 112. Such a band gap alignment configuration is beneficial for reducing punch through leakage.

Figure 2F:
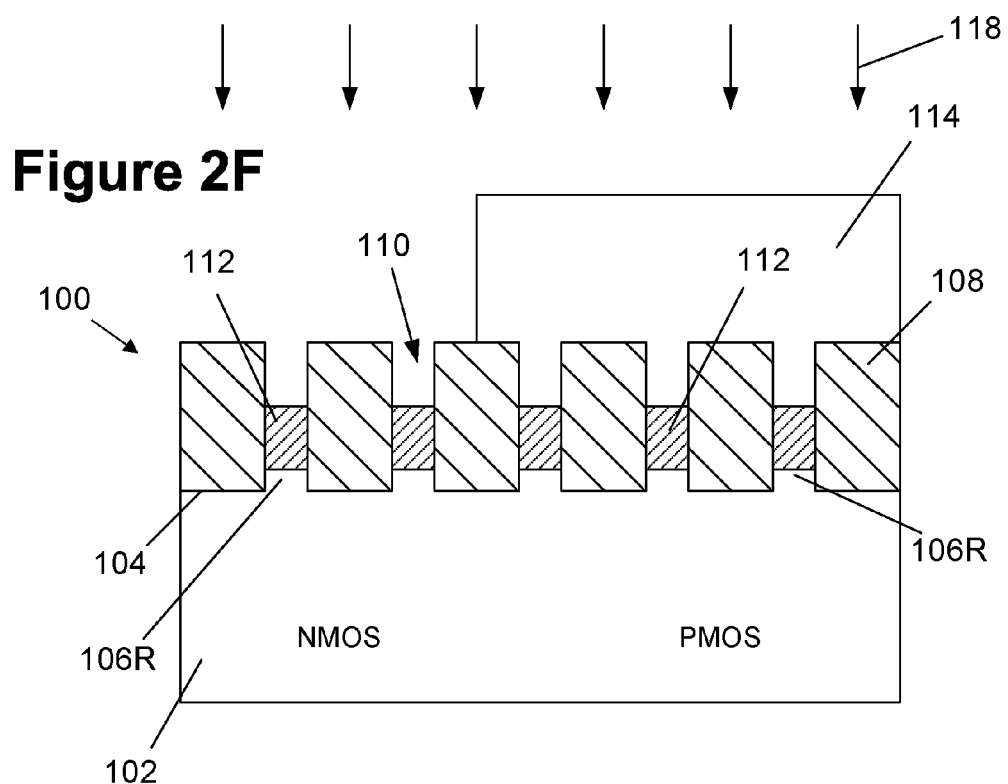

FIG. 2F depicts the product 100 after an optional P-type dopant implantation process 118 was performed to implant a P-type dopant, such as boron, into the exposed portion of the SRB layer 112. In one illustrative example, the P-type dopant implantation process 118 was performed using boron at a dopant dose of about 1E13-5E16 ions/cm$^2$ and at an energy level of about 5-60 keV. The purpose of the P-type dopant implantation process 118 is to reduce substrate leakage. If employed, the carbon implantation process 116 and the P-type dopant implantation process 118 may be performed in any desired order. It should be noted that, in the PMOS region, an ion implantation process (not shown) would have been performed to implant an N-type dopant, such as arsenic or phosphorous (well implant), into the SRB layer 112 in the PMOS region.

Figure 2G:
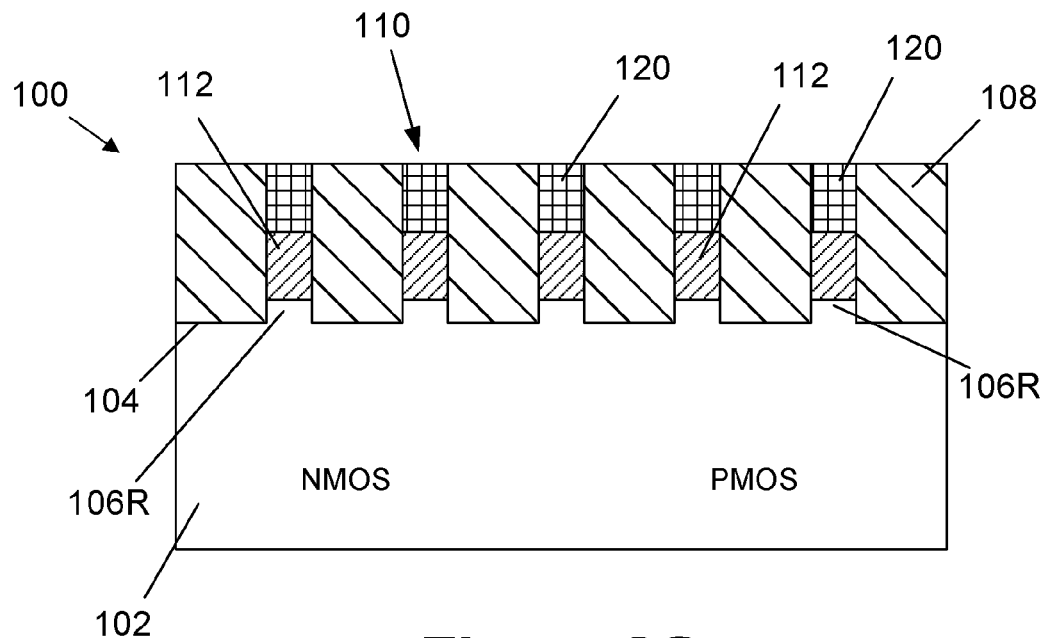

FIG. 2G depicts the product 100 after several process operations were performed. First, the masking layer 114 was removed. Thereafter, a channel semiconductor material layer 120 was formed on the strain relaxed buffer (SRB) layer 112 in the replacement fin cavities 110. The channel semiconductor material layer 120 may be formed to any desired thickness (or height) and it may be made of a variety of different materials. For example, in one embodiment, the growth of the channel semiconductor material layer 120 may be controlled such that it remains entirely within the replacement fin cavities 110. In other embodiments, the channel semiconductor material layer 120 may be formed such that it overfills the replacement fin cavities 110. In such a situation, a CMP process may be performed to remove excess amounts of the channel semiconductor material layer 120 positioned outside of the replacement fin cavities 110 so as to arrive at the structure depicted in FIG. 2G. In one embodiment, the channel semiconductor material layer 120 may be made of silicon germanium ($Si_{(1-x)}Ge_x$ where "x" ranges from 0-1), and it may be formed by performing an epitaxial growth process. Due to the implantation process (es) discussed above, the channel semiconductor material layer 120 is formed with a tensile stress in the NMOS region, while it is formed with a compressive stress in the PMOS region. That is, the implanted carbon atoms in the NMOS region reduce the lattice strain in the SRB layer 112 in the NMOS region by relaxing the SRB layer 112. The relaxed SRB layer 112 in the NMOS region has a similar or higher lattice constant than silicon, which will help when the channel semiconductor material layer 120 is formed in the NMOS region.

Figure 2H:
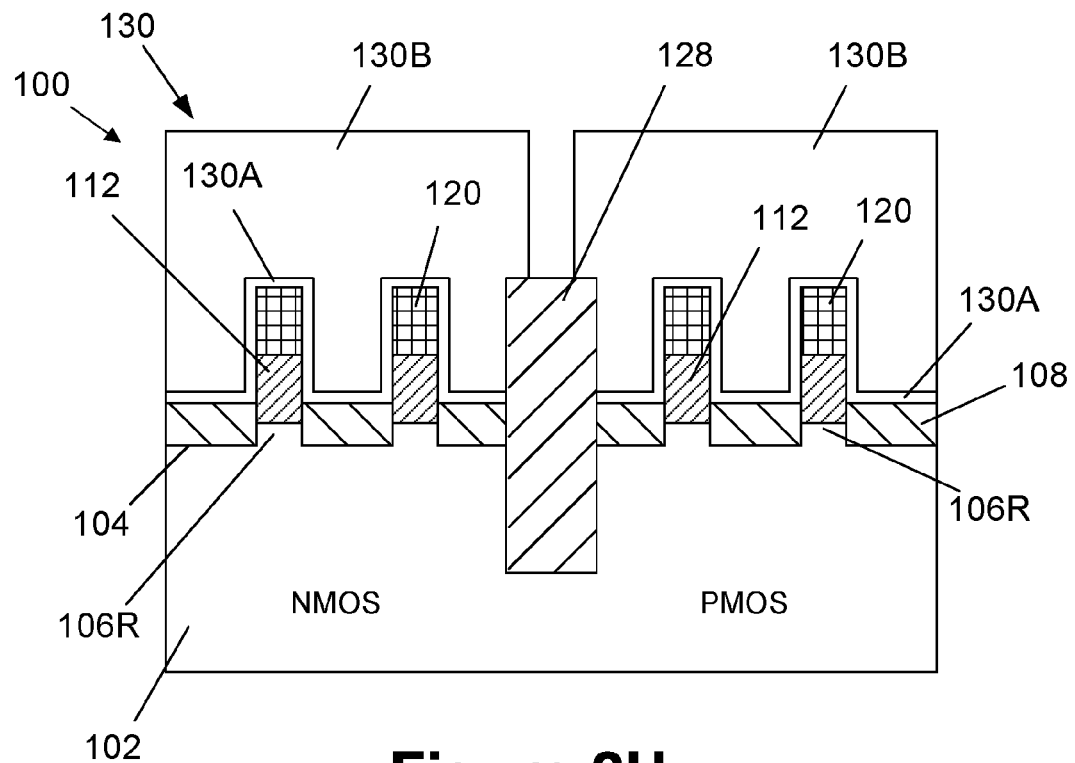

At the point of processing depicted in FIG. 2G, the illustrative FinFET based product 100 may be completed using traditional fabrication techniques. For example, FIG. 2H depicts the product 100 after an illustrative isolation region 128 has been formed between the devices and after illustrative and representative gate structures 130 have been formed on the NMOS and PMOS devices. Of course, the material of construction for the NMOS and PMOS devices may and likely will be different. In one illustrative embodiment, the schematically depicted gate structures 130 include an illustrative gate insulation layer 130A and an illustrative gate electrode 130B. The gate insulation layer 130A may be comprised of a variety of different materials, such as, for example, silicon dioxide, a so-called high-k (k greater than 10) insulation material (where k is the relative dielectric constant), etc. Similarly, the gate electrode 130B may also be of a material such as polysilicon or amorphous silicon, or it may be comprised of one or more metal layers that act as the gate electrode 130B. As will be recognized by those skilled in the art after a complete reading of the present application, the gate structures 130 of the product 100 depicted in the drawings, i.e., the gate insulation layer 130A and the gate electrode 130B, are intended to be representative in nature. That is, the gate structures 130 may be comprised of a variety of different materials and they may have a variety of configurations. The gate structures 130 may be made using either the so-called "gate-first" or "replacement gate" techniques.

Figure 2I:
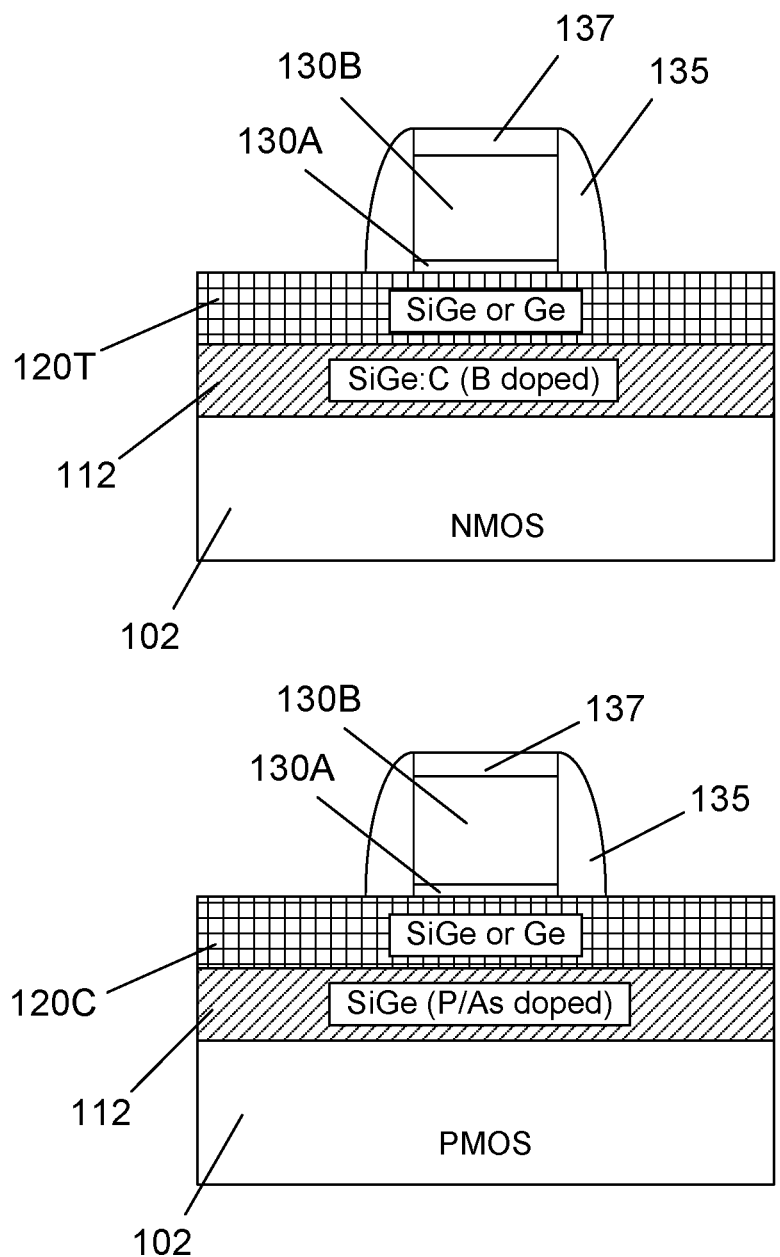

FIG. 2I is a cross-sectional view of the NMOS and PMOS devices taken along one of the replacement fins of the devices to show the different construction of the channel regions for the devices. FIG. 2I also depicts an illustrative sidewall spacer 135 (e.g., silicon nitride) and an illustrative gate cap layer 137 (e.g., silicon nitride). Accordingly, the novel methods disclosed herein provide a unique process flow that may be employed in CMOS applications wherein the band gap offset between PMOS and NMOS devices may be adjusted and a tensile-stressed channel material 120T may be formed for the NMOS devices, while a compressively stressed channel material 120C may be formed for the PMOS devices.

Figure 3A:
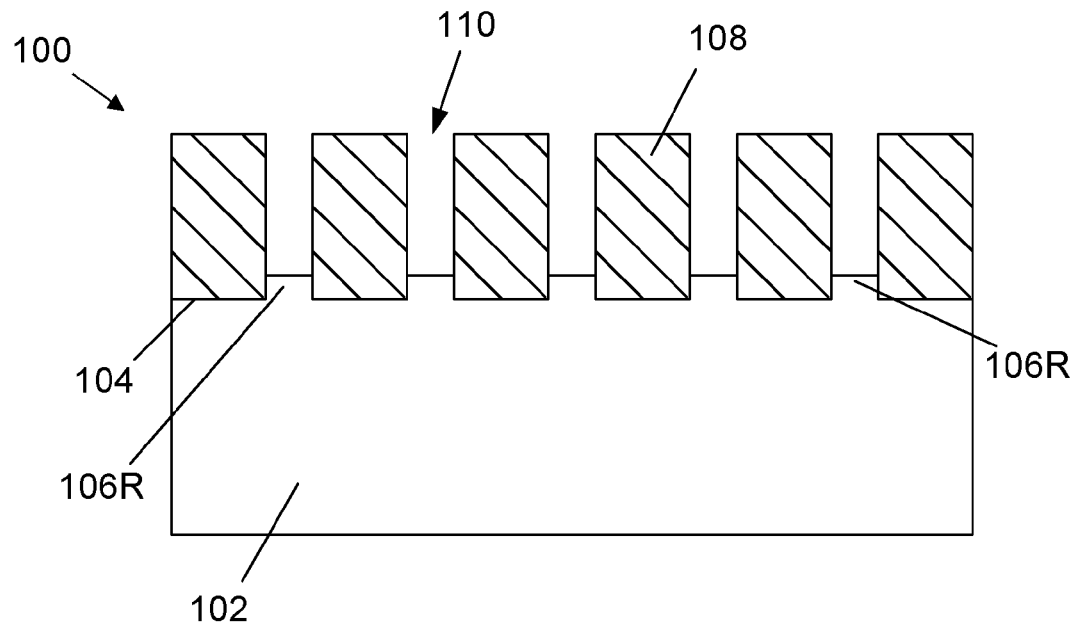

FIGS. 3A-3G depict other novel methods disclosed herein for forming NMOS and PMOS FinFET semiconductor devices with appropriate band offsets and the resulting product. FIG. 3A depicts the product 100 at a point in fabrication that corresponds to that shown in FIG. 2C, i.e., after the fins 106 were recessed thereby forming the replacement fin cavities 110.

Figure 3B:
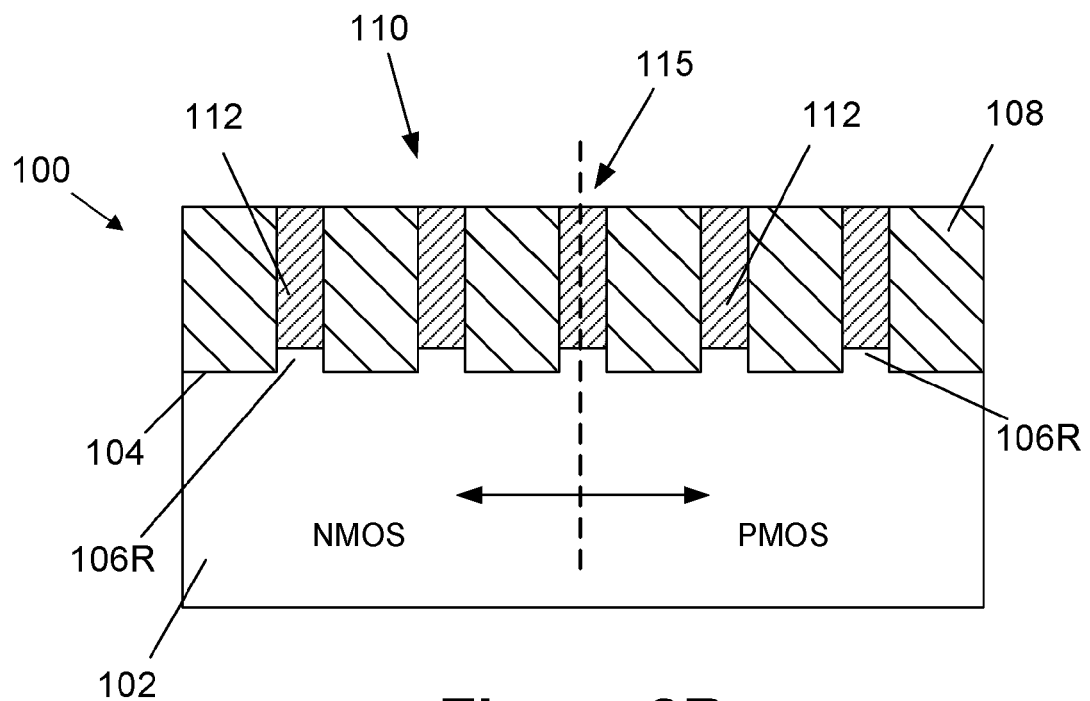

As shown in FIG. 3B, in this illustrative process flow, the above-described strain relaxed buffer (SRB) layer 112 was formed on the recessed fins 106R in such a manner so that it substantially fills the replacement fin cavities 110. In one embodiment, the growth of the SRB layer 112 may be controlled such that it remains entirely within the replacement fin cavities 110. In other embodiments, the SRB layer 112 may be formed such that it overfills the replacement fin cavities 110. In such a situation, a CMP process may be performed to remove excess amounts of the SRB layer 112 positioned outside of the replacement fin cavities 110 so as to arrive at the structure depicted in FIG. 3B.

FIG. 3C depicts the product 100 after the above-described masking layer 114 was formed so as to cover the PMOS region and expose the NMOS region for further processing. At that point, the above-described carbon implantation process 116 was performed to implant carbon atoms into the exposed portion of the SRB layer 112 in the NMOS region. As before, the carbon implantation process 116 may be designed such that the carbon is implanted throughout the entire thickness of the SRB layer 112.

FIG. 3D depicts the product 100 after the above-described, optional P-type dopant implantation process 118 was performed to implant a P-type dopant, such as boron, into the exposed portion of the SRB layer 112 in the NMOS region. As before, the P-type dopant implantation process 118 may be designed such that the P-type dopant is implanted throughout the entire thickness of the SRB layer 112.

Figure 3E:
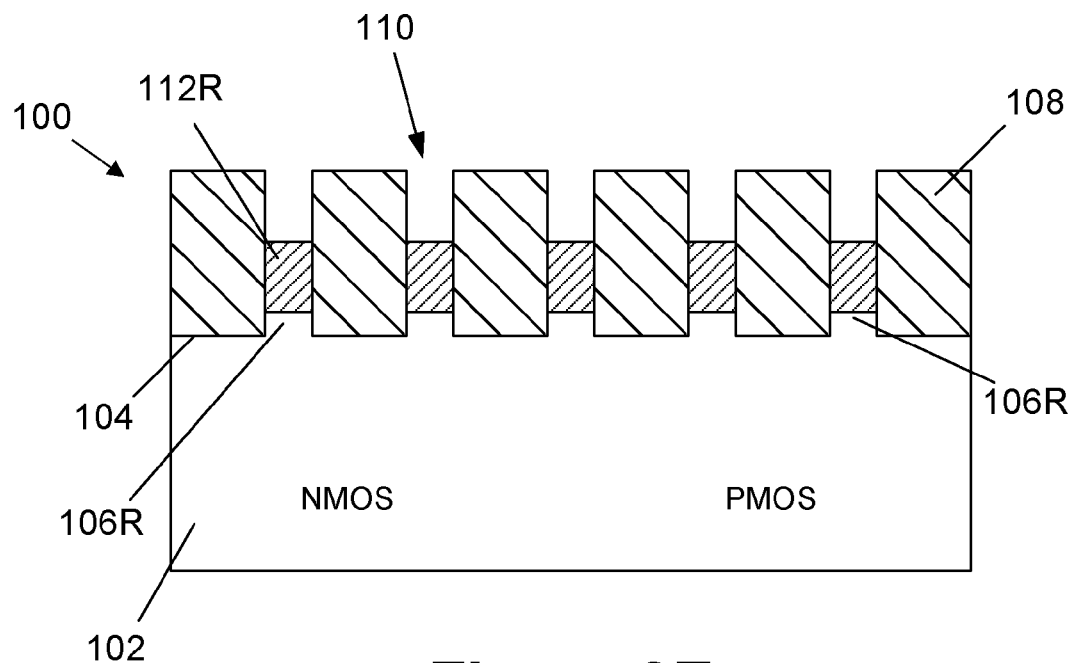

FIG. 3E depicts the product 100 after the masking layer 114 was removed and after a timed recess etching process was performed to remove portions of the SRB layer 112 and thereby define a recessed SRB layer 112R. The amount of the SRB layer 112 removed during the recess etching process may vary depending upon the particular application.

Figure 3F:
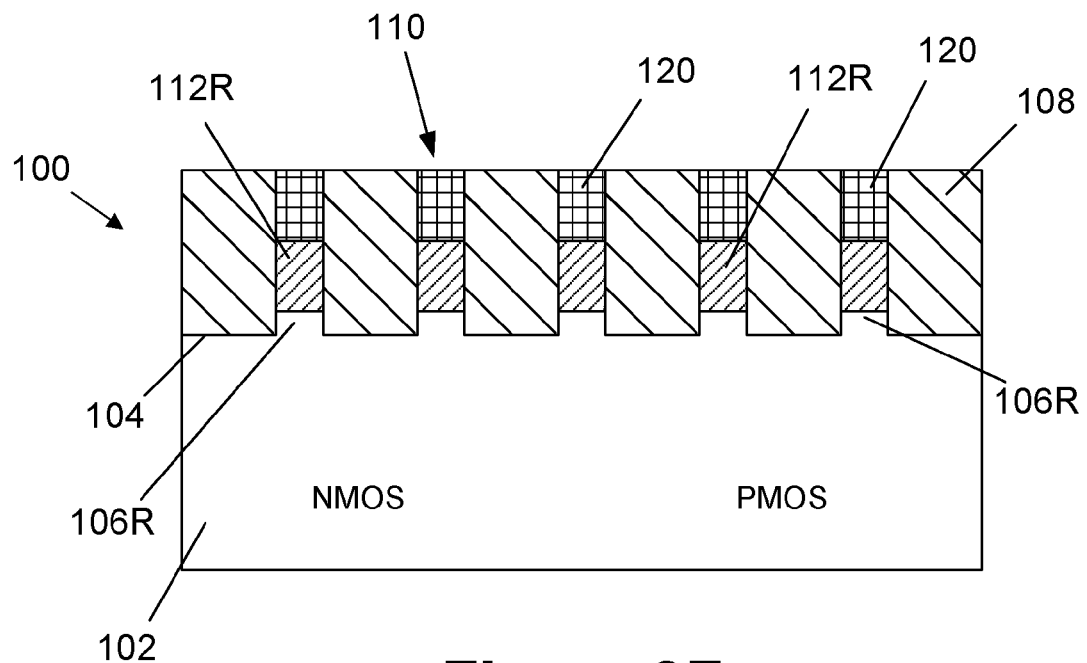

FIG. 3F depicts the product 100 after the above-described channel semiconductor material layer 120 was formed on the recessed SRB layer 112R in the replacement fin cavities 110. The channel semiconductor material layer 120 may be formed to any desired thickness (or height) and it may be made of a variety of different materials. For example, in one embodiment, the growth of the channel semiconductor material layer 120 may be controlled such that it remains entirely within the replacement fin cavities 110. In other embodiments, the channel semiconductor material layer 120 may be formed such that it overfills the replacement fin cavities 110. In such a situation, a CMP process may be performed to remove excess amounts of the channel semiconductor material layer 120 positioned outside of the replacement fin cavities 110 so as to arrive at the structure depicted in FIG. 3F.

Figure 3G:
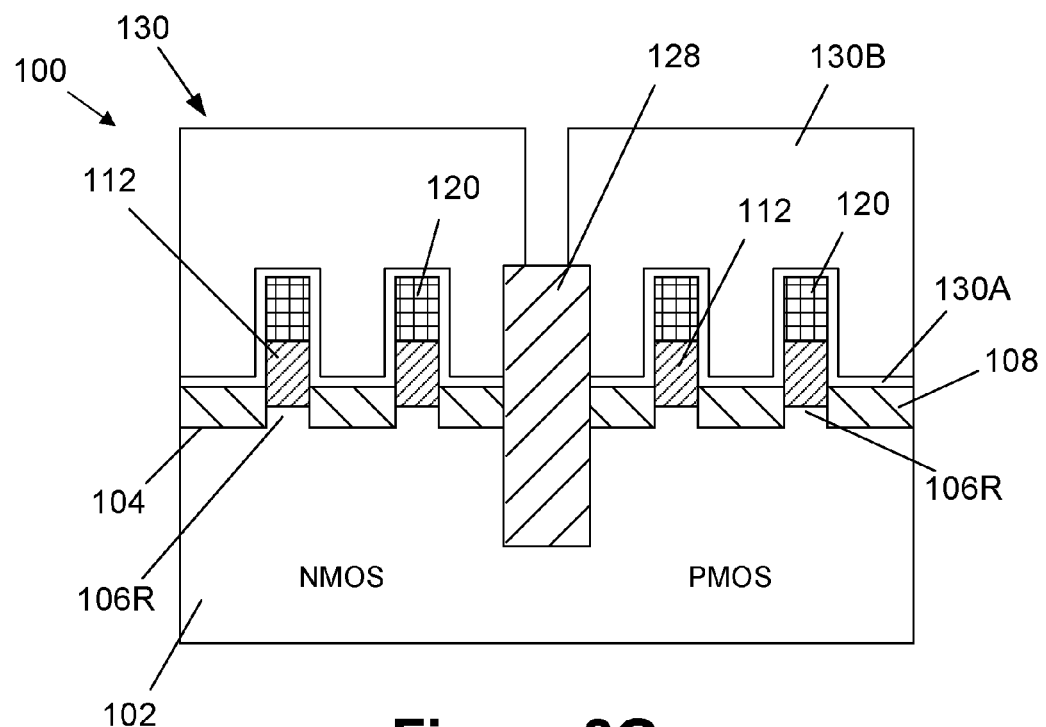

At the point of processing depicted in FIG. 3F, the illustrative FinFET based product 100 may be completed using traditional fabrication techniques. For example, FIG. 3G depicts the product 100 after the above-described illustrative isolation region 128 was formed between the devices and after the above-described representative gate structures 130 were formed on the NMOS and PMOS devices.

FIGS. 4A-4F depict yet other novel methods disclosed herein for forming NMOS and PMOS FinFET semiconductor devices with appropriate band offsets and the resulting product. In this embodiment, the materials added by way of implantation in the previous example may be added in situ, i.e., during the epitaxial growth processes described herein.

Figure 4A:
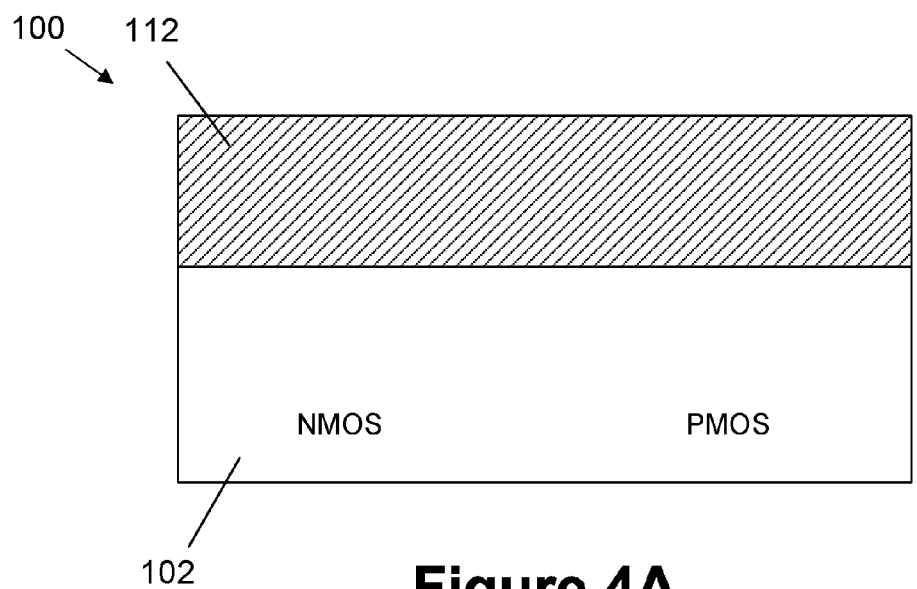
FIGS. 4A-4F depict yet other novel methods disclosed herein for forming NMOS and PMOS FinFET semiconductor devices with appropriate band offsets and the resulting product.

FIG. 4A depicts the product 100 after the above-described SRB layer 112 was grown on the upper surface of the substrate 102. The SRB layer 112 may be formed to any desired thickness.

Figure 4B:
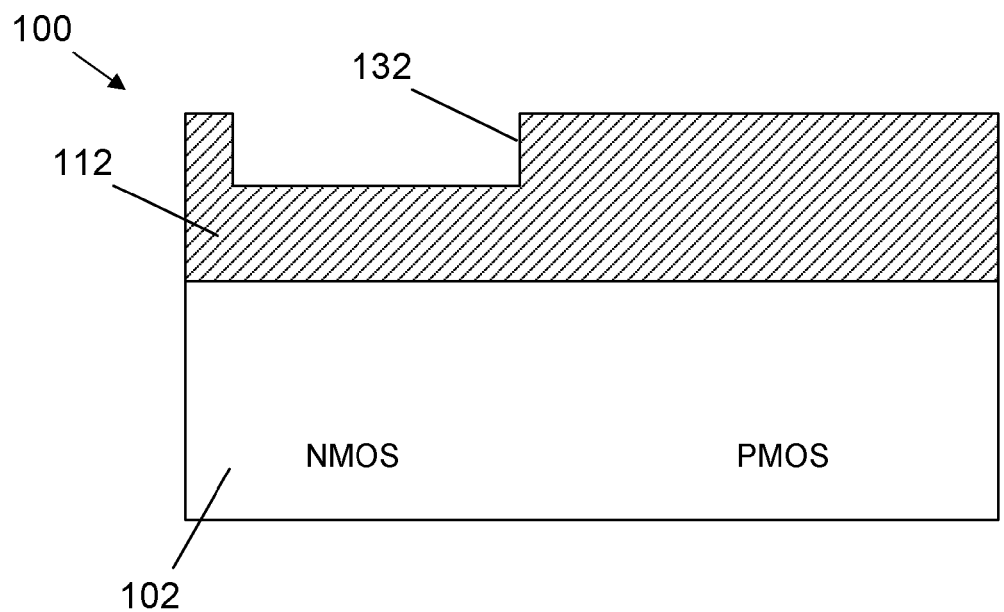

FIG. 4B depicts the product 100 after a trench 132 was formed in the SRB layer 112 in the region of the substrate 102 where NMOS devices will be formed. The size and depth of the trench 132 may vary depending upon the application.

Figure 4C:
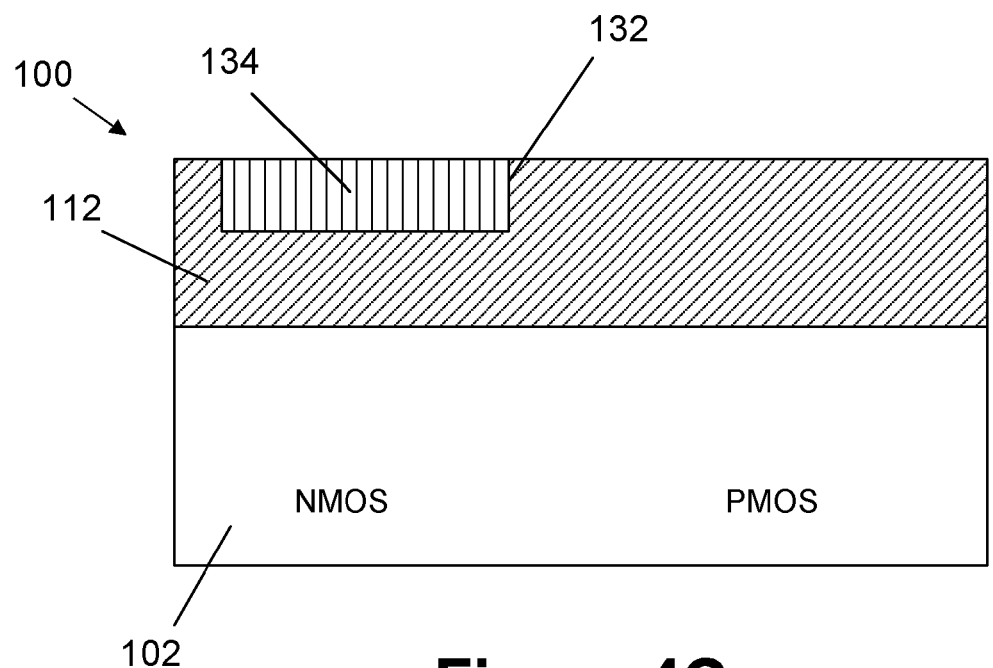

FIG. 4C depicts the product after an in situ carbon-doped SRB layer 134 was formed in the trench 132. The concentration of the carbon atoms within the in situ carbon-doped SRB layer 134 will be approximately the same as that achieved using the carbon implantation process 116 described above. In one illustrative embodiment, the carbon concentration within the in situ carbon-doped SRB layer 134 may fall within the range of about 1E19-1E21 ions/cm$^3$. Boron may also be introduced into the in situ carbon-doped SRB layer 134, since it will be located in an NMOS region of the substrate. In one embodiment, the growth of the in situ carbon-doped SRB layer 134 may be controlled such that it remains entirely within the trench 132 and substantially fills the trench 132. In other embodiments, the in situ carbon-doped SRB layer 134 may be formed such that it overfills the trench 132. In such a situation, a CMP process may be performed to remove excess amounts of the in situ carbon-doped SRB layer 134 positioned outside of the trench 132 so as to arrive at the structure depicted in FIG. 4C.

Figure 4D:
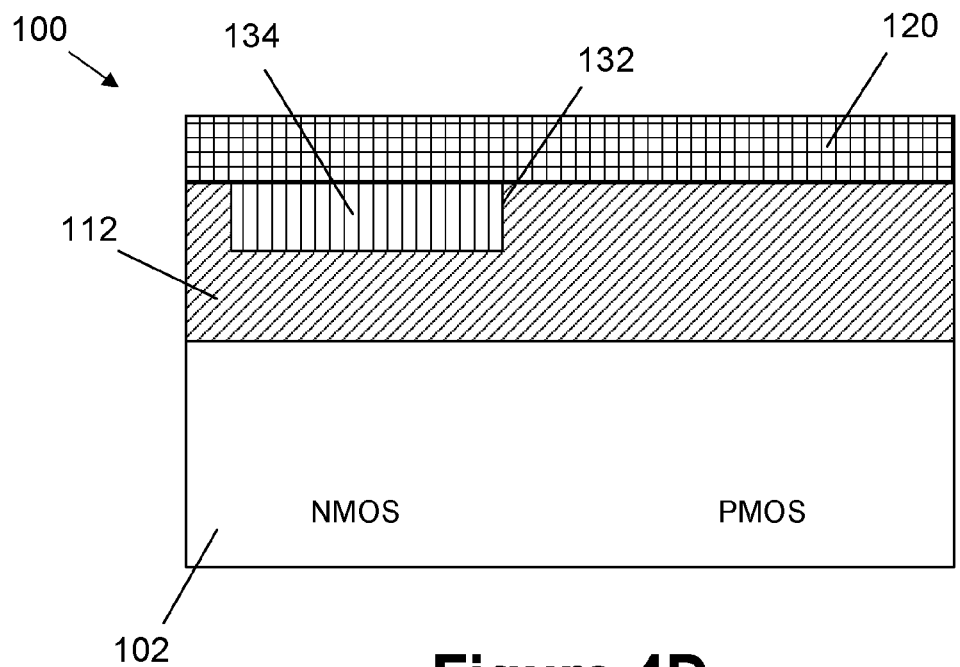

FIG. 4D depicts the product 100 after the above-described channel semiconductor material layer 120 was formed on the in situ carbon-doped SRB layer 134 (in the NMOS region) and the initial SRB layer 112. The channel semiconductor material layer 120 may be formed to any desired thickness (or height) and it may be made of a variety of different materials.

Figure 4E:
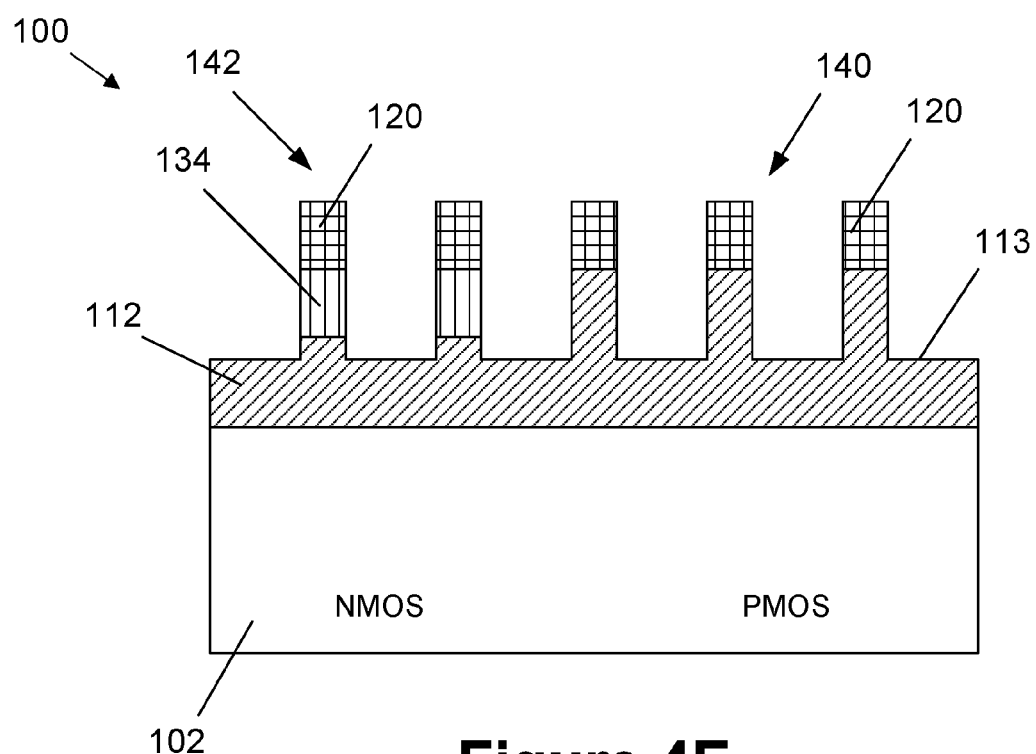

FIG. 4E depicts the product 100 after one or more etching processes, e.g., anisotropic etching processes, were performed through a patterned etch mask (not shown) to form a plurality of trenches 113 in the initial SRB layer 112 and thereby define a plurality of fins 140 (for the PMOS device) and fins 142 (for the NMOS device). The width and height of the fins 140, 142 may vary depending upon the particular application. Additionally, the overall size, shape and configuration of the trenches 113 and fins 140, 142 may vary depending on the particular application.

Figure 4F:
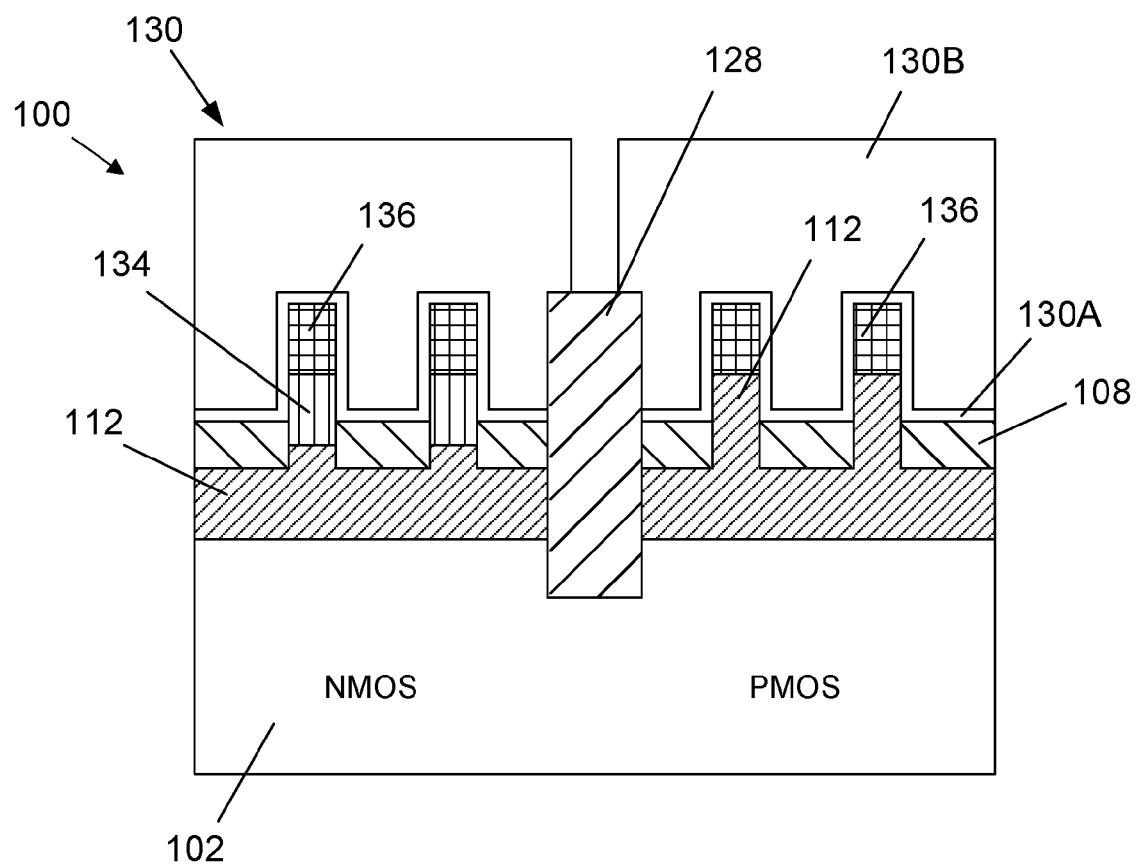

At the point of processing depicted in FIG. 4E, the illustrative FinFET based product 100 may be completed using traditional fabrication techniques. For example, FIG. 4F depicts the product 100 after a recessed layer of insulating material 108 was formed in the trenches 113, after the above-described illustrative isolation region 128 was formed between the devices and after the above-described representative gate structures 130 were formed on the NMOS and PMOS devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming NMOS and PMOS FinFET devices in an NMOS and PMOS region, respectively, of a semiconductor substrate, the method comprising:

forming an initial strain relaxed buffer layer on a surface of said semiconductor substrate;

forming a trench within said initial strain relaxed buffer layer in said NMOS region;

performing an epitaxial deposition process to form an in situ carbon-doped strain relaxed buffer layer in said trench;

forming a channel semiconductor material on said initial strain relaxed buffer layer and on said in situ carbon-doped strain relaxed buffer layer in said trench;

forming a plurality of fin-formation trenches that extend into said initial strain relaxed buffer layer so as to thereby form an NMOS fin comprised of said channel semiconductor material and said in situ carbon-doped strain relaxed buffer layer and a PMOS fin comprised of said channel semiconductor material and said initial strain relaxed buffer layer;

forming a recessed layer of insulating material around said NMOS fin and said PMOS fin in said fin-formation trenches so as to expose at least a portion of said NMOS fin and said PMOS fin;

forming a first gate structure around said NMOS fin; and forming a second gate structure around said PMOS fin.

2. The method of claim 1, wherein said initial strain relaxed buffer layer is comprised of silicon germanium ($Si_{(1-x)}Ge_x$ where "x" ranges from 0-1).

3. The method of claim 1, wherein said channel semiconductor material is comprised of silicon germanium ($Si_{(1-x)}Ge_x$ where "x" ranges from 0-1).

4. The method of claim 1, wherein said initial strain relaxed buffer layer is comprised of silicon germanium ($Si_{(1-x)}Ge_x$ where "x" ranges from 0-1) and said channel semiconductor material is comprised of substantially pure germanium.

5. The method of claim 1, wherein forming said initial strain relaxed buffer layer comprises performing an epitaxial deposition process.

6. The method of claim 1, wherein forming said channel semiconductor material comprises performing an epitaxial deposition process.

7. The method of claim 1, wherein a concentration of carbon in said in situ carbon-doped strain relaxed buffer layer falls within a range of about 1E19-1E21 ions/cm$^3$.

8. A method of forming NMOS and PMOS FinFET devices in an NMOS and PMOS region, respectively, of a semiconductor substrate, the method comprising:

forming a first silicon germanium layer on a surface of said semiconductor substrate;

forming a trench within said first silicon germanium layer in said NMOS region;

performing an epitaxial deposition process to form a second silicon germanium layer in said trench, wherein said second silicon germanium layer is carbon-doped;

forming a channel semiconductor material on said first silicon germanium layer and on said second silicon germanium layer in said trench;

forming a plurality of fin-formation trenches that extend into said first silicon germanium layer so as to thereby form an NMOS fin comprised of said channel semiconductor material and said second silicon germanium layer and a PMOS fin comprised of said channel semiconductor material and said first silicon germanium layer;

forming a recessed layer of insulating material around said NMOS fin and said PMOS fin in said fin-formation trenches so as to expose at least a portion of said NMOS fin and said PMOS fin;

forming a first gate structure around said NMOS fin; and forming a second gate structure around said PMOS fin.

9. The method of claim 8, wherein said first and second silicon germanium layers comprise strain relaxed buffer layers.

10. The method of claim 8, wherein said channel semiconductor material is comprised of substantially pure germanium.

11. The method of claim 8, wherein forming said first silicon germanium layer comprises performing an epitaxial deposition process.

12. The method of claim 8, wherein forming said channel semiconductor material comprises performing an epitaxial deposition process.

13. The method of claim 8, wherein a concentration of carbon in said second silicon germanium layer falls within a range of about 1E19-1E21 ions/cm$^3$.

14. The method of claim 8, wherein performing said epitaxial deposition process to form said second silicon germanium layer in said trench comprises overfilling said trench with said second silicon germanium layer and performing a planarization process to remove portions of said second silicon germanium layer positioned outside said trench.

15. The method of claim 8, wherein said second silicon germanium layer is carbon doped in situ during said epitaxial deposition process.

* * * * *